US008481472B2

(12) United States Patent
Westwood et al.

(10) Patent No.: US 8,481,472 B2
(45) Date of Patent: Jul. 9, 2013

(54) AQUEOUS ACIDIC FORMULATIONS FOR COPPER OXIDE ETCH RESIDUE REMOVAL AND PREVENTION OF COPPER ELECTRODEPOSITION

(75) Inventors: Glenn Westwood, Edison, NJ (US); Seong Jin Hong, Chungcheoungbuk-do (KR); Sang In Kim, Yongin (KR)

(73) Assignee: Avantor Performance Materials, Inc., Center Valley, PA (US)

( * ) Notice: Subject to any disclaimer, the term of this patent is extended or adjusted under 35 U.S.C. 154(b) by 109 days.

(21) Appl. No.: 12/998,296

(22) PCT Filed: Oct. 6, 2009

(86) PCT No.: PCT/US2009/059603
§ 371 (c)(1),
(2), (4) Date: Apr. 6, 2011

(87) PCT Pub. No.: WO2010/042457
PCT Pub. Date: Apr. 15, 2010

(65) Prior Publication Data
US 2011/0195887 A1    Aug. 11, 2011

Related U.S. Application Data

(60) Provisional application No. 61/104,098, filed on Oct. 9, 2008.

(51) Int. Cl.
*C11D 7/50* (2006.01)
*C11D 11/00* (2006.01)

(52) U.S. Cl.
CPC .................................. *C11D 11/0047* (2013.01)
USPC ............................................ 510/175; 510/176

(58) Field of Classification Search
USPC ................................................. 510/175, 176
See application file for complete search history.

(56) References Cited

U.S. PATENT DOCUMENTS

| | | | |
|---|---|---|---|
| 5,855,811 A | 1/1999 | Grieger et al. | 252/79.3 |
| 6,030,932 A | 2/2000 | Leon et al. | 510/175 |
| 6,044,851 A | 4/2000 | Grieger et al. | 134/1.3 |
| 6,224,785 B1 | 5/2001 | Wojtczak et al. | 252/79.1 |
| 6,361,712 B1 | 3/2002 | Honda et al. | 252/79.3 |
| 6,391,794 B1 | 5/2002 | Chen | 438/745 |
| 6,468,913 B1 | 10/2002 | Pasqualoni et al. | 438/693 |
| 6,468,951 B1 | 10/2002 | Grieger et al. | 510/175 |
| 6,755,989 B2 | 6/2004 | Wojtczak et al. | 252/79.1 |
| 6,777,380 B2 * | 8/2004 | Small et al. | 510/176 |
| 6,794,292 B2 | 9/2004 | Wu | 438/700 |
| 6,896,826 B2 * | 5/2005 | Wojtczak et al. | 252/79.1 |
| 6,967,169 B2 | 11/2005 | Wojtczak et al. | 438/710 |
| 7,129,199 B2 | 10/2006 | Zhang et al. | 510/175 |
| 7,247,208 B2 * | 7/2007 | Hsu | 134/3 |
| 7,393,819 B2 | 7/2008 | Hsu | 510/175 |
| 7,456,140 B2 * | 11/2008 | Small et al. | 510/175 |
| 7,534,753 B2 * | 5/2009 | Wu et al. | 510/175 |
| 7,605,113 B2 * | 10/2009 | Wojtczak et al. | 510/175 |
| 7,700,533 B2 * | 4/2010 | Egbe et al. | 510/175 |
| 7,718,590 B2 | 5/2010 | Suzuki et al. | 510/175 |
| 7,718,591 B2 * | 5/2010 | Hsu | 510/175 |
| 7,947,637 B2 * | 5/2011 | Kneer | 510/175 |
| 2003/0010751 A1 | 1/2003 | Wu | 216/105 |
| 2003/0078173 A1 * | 4/2003 | Wojtczak et al. | 510/175 |
| 2004/0149309 A1 | 8/2004 | Hsu | 134/3 |
| 2006/0014656 A1 * | 1/2006 | Egbe et al. | 510/175 |
| 2006/0091355 A1 | 5/2006 | Itano et al. | 252/79.1 |
| 2006/0172907 A1 | 8/2006 | Kim et al. | 510/175 |
| 2006/0287207 A1 | 12/2006 | Park et al. | 510/175 |
| 2006/0293208 A1 * | 12/2006 | Egbe et al. | 510/407 |
| 2007/0161528 A1 * | 7/2007 | Wu et al. | 510/175 |
| 2007/0232513 A1 * | 10/2007 | Hsu | 510/175 |
| 2008/0261847 A1 | 10/2008 | Visintin et al. | 510/176 |
| 2008/0269096 A1 | 10/2008 | Visintin et al. | 510/176 |

OTHER PUBLICATIONS

J. Gambino et al, "Self-aligned metal capping layers for copper interconnects using electroless plating", Microelectronic Engineering 83 (2006) 2059-2067.

* cited by examiner

*Primary Examiner* — Gregory Webb
(74) *Attorney, Agent, or Firm* — Hoffmann & Baron, LLP

(57) ABSTRACT

A highly aqueous acidic cleaning composition for copper oxide etch removal from Cu-dual damascene microelectronic structures and wherein that composition prevents or substantially eliminates copper redeposition on the Cu-dual damascene microelectronic structure.

13 Claims, No Drawings

AQUEOUS ACIDIC FORMULATIONS FOR COPPER OXIDE ETCH RESIDUE REMOVAL AND PREVENTION OF COPPER ELECTRODEPOSITION

This application is the U.S. National Phase Application under 35 U.S.C. §371 of PCT Application No. PCT/US2009/059603, filed 6 Oct. 2009, and claiming priority from U.S. Provisional Application No. 61/104,098 filed 9 Oct. 2008.

FIELD OF THE INVENTION

This invention relates to a microelectronic cleaning composition suitable for removing copper oxide etch residue and for prevention of copper electrodeposition and a process of cleaning microelectronic substrates using such compositions. The composition and process are particularly useful for cleaning post photoresist ash, post etch Cu-dual damascene microelectronic structures.

BACKGROUND TO THE INVENTION

Previously microelectronic structures employed aluminum alloys with silicon dioxide dielectrics for interconnect systems in integrated circuits. Numerous cleaning compositions were developed and available for satisfactorily cleaning post etch residue from such microelectronic substrates in the back end of the line (BEOL) processing. However, with the need for smaller and smaller geometries to meet the need for increased speed and integration density these aluminum/silicon dioxide interconnect systems have been shown to be inadequate. Consequently, copper-dual damascene structures with low-k dielectrics have been developed and are replacing the aluminum/silicon dioxide interconnects.

However, these Cu-dual damascene interconnect structures have presented a whole new set of parameters and problems for BEOL cleaning steps. For example, when employing a very diluted aqueous HF based acidic solution to produce a post-etch Cu-dual damascene structure on a silicon substrate, any $CuO_x$ and $Cu(OH)_2$ films or residues on the surface are dissolved in the acidic fluoride environment and thus produce large amounts of copper ($Cu^{2+}$) ions in the solution according the following equation.

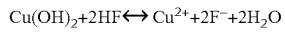

$Cu(OH)_2 + 2HF \leftrightarrow Cu^{2+} + 2F^- + 2H_2O$

As a result of copper vias in the structure, electrically connected through a P—N junction fabricated in the silicon substrate, there can occur significant undesirable redeposition (also called copper extrusion) where the copper vias are connected to the electron rich N doped regions by an electrochemical reaction as represented by the following reduction reaction equation.

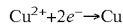

$Cu^{2+} + 2e^- \rightarrow Cu$

Such cathodic redeposition of copper is highly undesirable and results in large copper features that extend out from the specific vias which would result in defects during subsequent processing steps. It is also expected that Cu redeposition will occur in other cases where highly charged cathode surfaces are exposed to cleaning solutions where $Cu^{2+}$ is present as a result of the cleaning process It is therefore highly desirable to be able to provide an acidic compositions for use in copper oxide etch removal and wherein that composition prevents or substantially eliminates copper redeposition on a Cu-dual damascene microelectronic structure.

With the advent of the use of copper interconnects passivation of such interconnect has also changed. Instead of passivating the copper with dielectrics such as with SiN or SiCN dielectrics and addressing the resulting problems of such passivation, the industry has begun to avoid those problems with the use of self-aligned metal caps that produce improved electromagnetic and stress lifetimes by the use of, for example CoWP metal capping layers for the copper interconnects. However, it is important that the durability of the capping layer be maintained during etch and stripping processes. Therefore, in a further embodiment of the present invention it is desirable that the acidic composition for use in the copper oxide etch removal that prevents or substantially eliminates copper redeposition on a Cu-dual damascene microelectronic structure also be able to maintain the durability of the metal capping layer during etch and stripping processes.

SUMMARY OF THE INVENTION

In accordance with this invention there is provided a highly aqueous acidic cleaning composition for copper oxide etch removal from Cu-dual damascene microelectronic structures and wherein that composition prevents or substantially eliminates copper redeposition on the Cu-dual damascene microelectronic structure. The invention also provides a process for cleaning copper etch residue from a post photoresist ash, post etch Cu-dual damascene microelectronic structure wherein the process comprises (1) providing a microelectronic silicon substrate wafer having at least one post photoresist ash, post etch Cu-dual damascene structure having a via structure electrically connected with a $N^+$ diffusion region of the silicon substrate and (2) exposing the post photoresist ash, post etch Cu-dual damascene microelectronic structure to the cleaning composition of this invention for a cleaning effective time and temperature to clean the post photoresist ash, post etch Cu-dual damascene microelectronic structure. In a further aspect of this invention there is provided a highly aqueous acidic cleaning composition for copper oxide etch removal from Cu-dual damascene microelectronic structures having metal capping layers wherein that composition not only prevents or substantially eliminates copper redeposition on the Cu-dual damascene microelectronic structure during the cleaning step but also prevents or substantially eliminates etching of the metal capping layer (such as a CoWP metal capping layer) during the cleaning process when such metal capping layers are present in the microelectronic structure.

The cleaning composition of this invention comprises a formulation having a pH of from about 4.3 to about 5.5 and comprising, consisting essentially of, or consisting of the following components: water, at least one alkanolamine or aminophenol, at least one metal chelating agent, at least one tetraalkylammonium fluoride, HF, and optionally, but preferably, at least a non-ionic surfactant that contains ethylene oxide chains or ethylene oxide/ethylene glycol chains. When such a cleaning composition is to be employed to clean such microelectronic structures where there is present on the structure a metal capping layer such as a CoWP it is desired that the formulation additionally contain a reducing agent to inhibit etching of the capping layer and thereby preserve its durability. The formulation may initially be formulated as a concentrate to be later diluted with additional water for use or may be formulated as a ready to use composition. In one, and generally preferred, embodiment of this invention the formulation comprises, consists essentially of, or consists of water, monoethanolamine, 1,2-cyclohexanediamine tetraacetic acid (Cy-DTA) chelator, tetramethylammonium fluoride, HF and a polyoxyethylene substituted alkynol surfactant (Surfynol™ 465). An optional form of a preferred embodiment of the formulation of this invention comprises, consists essentially of, or consists of water, monoethanolamine, 1,2-cyclohexanediamine tetraacetic acid (CyDTA) chelator, tetramethylammonium fluoride, HF, a polyoxyethylene substituted alkynol surfactant (Surfynol™ 465), and a reducing agent, preferably ascorbic acid to protect the metal capping layer.

The cleaning composition will be exposed to or brought into contact with the post etch Cu-dual damascene microelectronic structure for any suitable time and at any suitable temperature for effectively cleaning the structure of post etch residue without any significant copper electrodeposition occurring on the structure.

DETAILS AND PREFERRED EMBODIMENTS OF THE INVENTION

The highly aqueous acidic cleaning composition of this invention is for copper oxide etch residue removal from Cu-dual damascene microelectronic structures without significant copper redeposition on the Cu-dual damascene microelectronic structure. The process for cleaning copper etch residue from a post photoresist ash, post etch Cu-dual damascene microelectronic structure in accordance with this invention is a process wherein the process comprises (1) providing a microelectronic silicon substrate wafer having at least one post photoresist ash, post etch Cu-dual damascene structure having a via structure electrically connected to with a $N^+$ diffusion region of the silicon substrate and optionally having metal capping, and (2) exposing or contacting the post photoresist ash, post etch Cu-dual damascene microelectronic structure to the cleaning composition of this invention for a cleaning effective time and temperature to clean the post photoresist ash, post etch Cu-dual damascene microelectronic structure.

The cleaning composition of this invention comprises a formulation having a pH of from about pH 4.3 to about pH 5.5 and is a formulation comprising, consisting essentially of, or consisting of the following components: water, at least one alkanolamine or aminophenol, at least one metal chelating agent, at least one tetraalkylammonium fluoride, HF, and optionally, but preferably, at least a non-ionic surfactant that contains ethylene oxide chains or ethylene oxide/ethylene glycol chains. In a further embodiment of this invention the cleaning composition comprises a formulation having a pH of from about pH 4.3 to about pH 5.5 and is a formulation comprising, consisting essentially of, or consisting of the following components: water, at least one alkanolamine or aminophenol, at least one metal chelating agent, at least one tetraalkylammonium fluoride, HF, a reducing agent, and optionally, but preferably, at least a non-ionic surfactant that contains ethylene oxide chains or ethylene oxide/ethylene glycol chains.

The cleaning composition of this invention will have the following amounts of the required components in the formulation: from about 68.4% to about 98.95% by weight water, from about 0.3% to about 8% by weight alkanolamine or aminophenol, from about 0.1 to about 2% by weight metal chelator, from about 0.05% to about 1.6% by weight tetraalkylammonium fluoride, from about 0.10% to about 5% by weight HF, and, when present in the composition, from greater than 0% to about 15%, preferably about 0.5% to about 15% by weight surfactant based on the total weight of the formulation. Additionally the cleaning composition may have from about 0.5% to 20% of at least one reducing agent, based on the total weight of the other components in the formulation. When a reducing agent is to be part of the formulation the reducing agent is present in the composition in its ready to use (not concentrated) form. All percentages mentioned in this application are weight percent based on the total weight of the formulation of the cleaning composition unless indicated otherwise.

The at least one alkanolamine or aminophenol component may be any suitable alkanolamine or aminophenol. The alkanolamine is generally selected from alkanolamines of from 2 to about 10 carbon atoms, preferably having 2 to 6 carbon atoms, more preferably having from 2 to 4 carbon atoms, and most preferably having 2 carbon atoms. More than one alkanolamine or more than one aminophenols may be employed as well as a combination of one or more alkanolamine combined with one or more aminophenols. The preferred alkanolamine is monoethanolamine. The aminophenol is preferably 4-aminophenol. When a combination of an alkanolamine and an aminophenol is employed the combination is preferably monoethanolamine with 4-aminophenol. The amount of the alkanolamine or aminophenol component will generally be from about 0.3% to about 8% by weight of the composition, preferably from about 0.3% to about 4% by weight, and more preferably from about 0.35% to about 4% by weight. In the concentrated formulation the alkanolamine/aminophenol component will generally comprise about 3% to about 8%, preferably about 3% to about 4%, and more preferably about 3.5 to about 4%, and even more preferably about 3.85% by weight, and in the diluted ready to use formulation the at least one alkanolamine/aminophenol component will comprise from about 0.3% to about 0.8%, preferably about 0.3% to about 0.4%, and more preferably about 0.35% to 0.4%, and even more preferably about 0.35% by weight.

While any suitable metal chelator compound may be employed as the metal chelator component of the composition of this invention, the at least one metal chelator component is generally selected from 1,2-cyclohexanediamine tetraacetic acid (CyDTA), N-3[(trimethoxysilyl)-propyl] diethylenetriamine, 1,4,8,11-tetraazacyclotetradecane; phthalocyanine, 4,7-dihydroxy-1,10-phenanthroline, neocuproine, cuprizone, 1,6-dimethyl-1,4,8,11-tetranzacyclotetradecane, 2,2' dipyridyl, ethylenediamine tetraacetic aid (EDTA), catechol, (diethylenetriaminepentaacetic acid (DTPA), polyethyleneimine, N,N,N',N'-ethylenediaminetetra(methylenephosphonic) acid (EDTMP), diethylenetriaminepentaacetic acid (DETPA), ethylenediaminetetrapropionic acid, (hydroxyethyl)ethylenediaminetriacetic acid (HEDTA), aminotrimethylenephosphonic acid, and 1-hydroxy ethylidene-1,1-Diphosphonic Acid (HEPD). Preferred chelating agents are aminocarboxylic acids such as EDTA, CyDTA and aminophosphonic acids such as EDTMP, and most preferably CyDTA. The at least one metal chelator component will generally comprise from about 0.1% to about 2% by weight of the composition, preferably from about 0.15% to about 2%, and more preferably from about 0.17%. to about 1.9%. In the concentrated formulation the metal chelator component will generally comprise about 1% to about 2%, preferably about 1.5% to about 2%, more preferably about 1.7% to about 1.9%, and most preferably about 1.87% by weight, and in the diluted ready to use formulation the at least one metal chelator component will comprise from about 0.1% to about 0.2%, preferably about 0.15% to about 0.2%, more preferably from about 0.17% to about 0.19% and most preferably about 0.17% by weight.

Any suitable tetraalkylammonium fluoride may be employed in the compositions of this invention. Such suitable tetraalkylammonium fluorides will have the formula $(R)_4N^+ F^-$, where each R is independently a substituted or unsubstituted alkyl group, preferably alkyl of from 1 to 22, and more preferably 1 to 6, even more preferably 1 to 4, and most preferably 1 carbon atoms, such as tetramethylammonium fluoride, tetraethylammonium fluoride, tetrapropylammonium fluoride and tetrabutylammonium fluoride salts, preferably tetramethylammonium fluoride. The at least one tetraalkylammonium fluoride component of the composition of this invention will generally be present in the composition in an amount of from about 0.05 to about 1.6%, preferably from about 0.05% to about 1% and more preferably from about 0.05% to about 0.8% by weight. In the concentrated formulation the at least one tetraalkylammonium component will generally comprise about 0.5 to about 1.6%, preferably about 0.5% to about 1%, and more preferably about 0.5 to about 0.8%, and more preferably about 0.77% by weight, and in the diluted ready to use formulation the at least one tetraalkylammonium fluoride component will generally comprise from about 0.05% to about 0.16%, preferably from about 0.05 to 0.1% and more preferably from about 0.05% to about 0.08%, and still more preferably about 0.07% by weight.

The hydrogen fluoride component of the composition of this invention will generally be present in the composition in an amount of from about 0.1% to about 5%, preferably from about 0.1% to about 2%, more preferably from about 1% to about 1.5% by weight. In the concentrated formulation of the composition the HF component will generally be present in an amount of from about 1% to about 5%, preferably from about 1 to 2%, more preferably from about 1% to about 1.5% and most preferably about 1.2% by weight, and in the ready to use formulation the HF component will be present in an amount of from about 0.1% to about 0.5%, preferably from about 0.1% to about 0.2%, more preferably from about 0.1% to about 0.15%, more preferably about 0.11% by weight.

Any suitable non-ionic surfactant containing ethylene oxide chains or ethylene oxide/ethylene glycol chains may optionally be employed as the at least one non-ionic surfactant component in the cleaning compositions of this invention. More preferably the at least one non-ionic surfactant is an ethylene oxide substituted alkynol compound. Suitable non-ionic surfactants include, but are not limited to polyethyleneglycol, triethylene glycol, tetraethylene glycol and ethylene oxide substituted alkynols containing from about 2 to about 20 carbon atoms, preferably from about 2 to 15 and more preferably from about 5 to about 15 carbon atoms in the alkynol chain. An especially preferred acetylenic non-ionic surfactant is Surfynol™ 465 of the following formula.

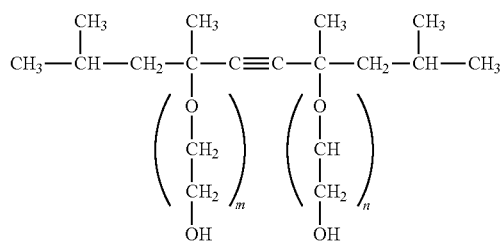

The at least one non-ionic surfactant component of the composition when present in the compositions of this invention will generally be present in the composition in an amount of from greater than 0% to about 15%, preferably from about 0.5% to about 15%, more preferably from about 1% to about 15% and still more preferably from about 1.3% to about 14.3% by weight. In the concentrated formulation of the composition the at least one non-ionic surfactant component will generally be present in an amount of from about 5% to about 15%, preferably from about 10% to 15%, more preferably from about 13% to about 15%, and even more preferably about 14.3% by weight, and in the ready to use formulation the at least one non-ionic surfactant component will be present in an amount of from greater than 0% to about 1.5%, preferably about 0.5% to about 1.5, more preferably from about 1% to about 1.5%, still more preferably from about 1.3% to about 1.5%, and even more preferably about 1.3% by weight.

When a reducing agent is employed in the cleaning composition to protect any metal capping layer present in the microelectronic structure any suitable reducing agent may be employed. Examples of suitable reducing agent include, but are not limited to, ascorbic acid, tocopherol, phosphorus acid formaldehyde, formic acid, hydrazine, and monosaccharide reducing agent such as fructose, glucose glyceraldehydes, lactose, arabinose, maltose, and the like. Ascorbic acid and fructose are preferably employed and more preferably ascorbic acid. The amount of the optional reducing agent employed in the ready to use composition will generally be from about 0.5% to about 20% by weight, preferably from about 1% to about 10%, and even more preferably from about 2% to about 6% based on the total weight of the other components in the formulation.

The water will be present in the composition of this invention in an amount of from about 68.4% to about 98.95% by weight, preferably 76.5% to about 98%, more preferably about 78% to about 98% by weight. In the concentrated formulation of this invention the water will generally comprise from about 69.4% to about 89.5%, preferably from about 76% to about 84%, more preferably from about 76.8 to 80.3% and even more preferably about 78% by weight, and in the ready to use formulation of this invention the water will comprise from about 96.86% to about 98.95%, preferably from about 97.6% to about 98.4%, more preferably about 97.68% to about 98.03% and even more preferably about 98% by weight.

The concentrated formulation of this invention will generally be diluted with additional water in a ratio of additional water to concentrated formulation of from about 8:1 to about 12:1, preferably 9:1 to about 11:1, and more preferably about 10:1.

A preferred example of a concentrated formulation of this invention will have about 78 parts water, about 3.85 parts alkanolamine/aminophenol, about 1.87 parts metal chelator, about 0.77 parts tetraalkylammonium fluoride, about 1.2 parts HF and about 14.3 parts non-ionic surfactant wherein the parts are parts by weight. Such a preferred concentrate formulation is diluted with 10 parts by weight additional water to 1 part by weight of the concentrated formulation to provide a ready to use diluted formulation having about 98 parts water, about 0.35 parts alkanolamine/aminophenol, about 0.17 parts metal chelator, about 0.07 parts tetraalkylammonium fluoride, about 0.11 parts HF and about 1.30 parts non-ionic surfactant, wherein the parts are parts by weight of the total formulation. A specific preferred concentrate formulation of this invention will have about 78 parts water, about 3.85 parts monoethanolamine, about 1.87 parts CyDTA, about 0.77 parts tetramethylammonium fluoride, about 1.2 parts HF and about 14.3 parts Surfynol™ 465 non-ionic surfactant, wherein the parts are parts by weight. When this concentrate is diluted with 10 parts water per part of concentrate a preferred ready to use formulation is provided having about 98 parts water, about 0.35 parts monoethanolamine, about 0.17 parts CyDTA, about 0.07 parts tetramethylammonium fluoride, about 0.11 parts HF and about 1.3 parts Surfynol™ 465 non-ionic surfactant, wherein the parts are parts by weight. In the afore-mentioned ready to use formulation there may also be present about 0.5 to 20 parts reducing agent, preferably ascorbic acid. The reducing agent may be added to a ready to use diluted formulation once it is obtained from diluting of a concentrate, or the ready to use formulation with the reducing agent may be formed directly by combining the components of the ready to use formulation in the concentrations required by the ready to use formulation.

The ready to use formulation can be employed to clean copper etch residue from a post photoresist ash, post etch Cu-dual damascene microelectronic structure wherein the process comprises providing a microelectronic silicon substrate wafer having at least one post photoresist ash, post etch Cu-dual damascene structure having a via structure electrically connected with a $N^+$ diffusion region of the silicon substrate wherein the substrate optionally has a metal capping layer, preferably CoWP, and exposing or contacting the post photoresist ash, post etch Cu-dual damascene microelectronic structure to the cleaning composition of this invention for a cleaning effective time and temperature to clean the post photoresist ash, post etch Cu-dual damascene microelectronic structure.

The cleaning process can be conducted at any suitable cleaning effective temperature and time. Generally the cleaning process will be conducted by exposing or contacting the post photoresist ash, post etch Cu-dual damascene structure to a cleaning composition of this invention at a temperature of from about 25° C. to about 80° C., preferably from about 25° C. to about 45° C., and more preferably at a temperature of about 25° C., and for a period of time of from about 30 sec. to about 10 min., preferably about 30 sec. to about 2 min., more preferably about 30 sec.

Example 1

The following examples are illustrative of compositions of this invention (Formulations B, E and H) versus compositions outside the scope of this invention (Formulations A, C, D, F, G and I) and their effectiveness in cleaning copper etch residue from a post photoresist ash, post etch Cu-dual damascene microelectronic structure and for preventing or substantially eliminating electrodeposition of copper back onto the structure. The wafer was cleaned in the respective formulations at 35° C., 200 RPM. The wafers employed were Cu-dual damascene process integrated circuit wafers having front-end devices present, a top layer of Black Diamond™ dielectric with vias etched in them down to the copper. The wafers contained copper oxide ash residue on bottoms of the vias and photoresist ashed residue on top of the dielectric. The results are presented in Table 1.

TABLE 1

| Formulation | $H_2O$ | MEA | Surfynol™ 465 | TMAF | dHF | CyDTA | Redeposition Score |
|---|---|---|---|---|---|---|---|
| A | 97.49 | 0.86 | 1.30 | 0.07 | 0.11 | 0.17 | 28 |
| B | 98.00 | 0.35 | 1.30 | 0.07 | 0.11 | 0.17 | 11.5 |
| C | 98.26 | 0.09 | 1.30 | 0.07 | 0.11 | 0.17 | 28 |
| D | 98.66 | 0.86 | 0.13 | 0.07 | 0.11 | 0.17 | 42 |
| E | 99.17 | 0.35 | 0.13 | 0.07 | 0.11 | 0.17 | 19.5 |
| F | 99.43 | 0.09 | 0.13 | 0.07 | 0.11 | 0.17 | 26 |
| G | 98.79 | 0.86 | 0 | 0.07 | 0.11 | 0.17 | 33 |
| H | 99.30 | 0.35 | 0 | 0.07 | 0.11 | 0.17 | 18.5 |
| I | 99.56 | 0.09 | 0 | 0.07 | 0.11 | 0.17 | 37 |

These results show the effect of MEA and Surfynol™ 465 on redeposition. The redeposition score number is obtained by looking at 21 vias and assigning a score between 0 and 2 for each where 2 is filled with redeposition material and 0 has no redeposited material and summing these values for all the vias. Low score is good performance while high score is bad. Formulations with high (0.86%) and low amounts (0.09%) amounts of MEA produced unacceptably high redeposition scores high whereas those with 0.35 MEA produced acceptable redeposition scores. The presence of surfactant (Formulation B) permits the compositions of the invention to perform better than a composition of the invention (Formulation H) having no surfactant present.

Example 2

These following experiments were conducted on the same type of wafers as employed in Example 1 and compares the cleaning chemistries of formulations of this invention to dHF (dilute HF, the current process formulation employed in most fabrication lines for this kind of CuOx removal process). Improved (lower) Cu and TEOS etch rates, and comparable CuOx etch rates as reported in Table 2 are obtained for formulations of this invention compared to the dHF formulation. A dramatic decrease in the amount of redeposited Cu was also observed after cleaning with the formulations of this invention when compared to dHF as also reported in Table 2.

TABLE 2

| Formulation | Surfynol™ 465 | Redeposition Score | Cu etch rate (Å/min.) | TEOS etch rate (Å/min.) | CuOx Etch rate (Å/min.) |
|---|---|---|---|---|---|
| dHF (200:1) | 0 | 42 | 6.41 | 16.97 | >800 |
| H | 0 | 18.5 | 0.62 | 0.73 | >800 |
| B | 1.30 | 11.5 | 1.05 | 0.73 | >800 |

Example 3

Below are etch rates of Formulation B at different pHs by addition of TMAH (25%) or dHF (0:1). The same type of wafers as employed in Example 1 were employed here. This data in Table 3 shows the optimal pH range of pH 4 to pH 5.5 for low Cu and TEOS etch rates and high CuOx removal rates and demonstrates the balance between these features for the compositions of this invention.

TABLE 3

| pH | Cu etch rate (Å/min.) | TEOS etch rate (Å/min.) | CuOx etch rate (Å/min.) |
|---|---|---|---|
| 8 | 110 | <0.10 | 114 |
| 7 | 88.7 | 0.30 | 320 |
| 5.5 | 1.47 | <0.10 | >800 |
| 5.0 | 1.37 | 0.50 | >800 |
| 4.8 | 0.95 | <0.10 | >800 |
| 4.3 | 0.78 | 7.23 | >800 |
| 4.0 | 1.21 | 26.00 | >800 |

Example 4

Ready to use formulations were prepared and comprised 100 g $H_2O$, 10 g HF (50:1); 0.40 g MEA; 0.20 g CYDTA; 0.40 g TMAF; 1.23 g Surfynol™ 465 and the pH brought to 4, 5.5, 7.0, 8 with HF or MEA. 30 g of each of the formulations then had added thereto 0.14 g NaCl (electrolyte) and 0.14 g $CuSO_4$ and then the pH was readjusted to original value with MEA. The formulations were run in a container with an Au electrode, glassy carbon counter electrode, and Ag/AgCl reference electrode. The formulations were tested by cyclic voltammetry from −1.0 V to +1.0 V, and the results were monitored for Cu 2+ reduction in solution. The results at the various pHs are set forth in Table 4.

TABLE 4

| pH | Potential of Cu reduction peak |
| --- | --- |
| 4 | −0.41 V |
| 5.5 | −0.44 V |
| 7 | −0.65 V |
| 8 | −0.68 V |
| 200:1 HF | −0.15 V |

The more negative the potential is, the more difficult it is to reduce copper in the solution. Increased pH makes it more difficult to reduce Cu2+ in these solutions. At the pH range 4 to 5.5 of this invention Cu2+ is desirably much more difficult to reduce than in dilute HF (200:1), the standard CuOx stripping chemistry.

Example 5

As an example of the ability of cleaning formulations of this invention containing a reducing agent in order to protect the durability of and inhibiting etching of metal capping layers employed with Cu-dual damascene microelectronic structures was demonstrated by subjecting unpatterned CoWP caped Cu to cleaning with (1) a formulation (5A) of this invention but not containing the optional reducing agent, (2) a formulation (5B) of this invention containing the optional reducing agent, and (3) as Comparative Control a 100:1 dHF composition. The cleaning took place at 25° C. for a period of 2 minutes after which the CoWP etch rate was determined. The formulations were as follows. Formulation 5A=0.35% ethanolamine, 0.17% CyDTA, 0.07% TMAF, 0.11% HF, 0.60% Surfynol®, the remainder water. Formulation 5B=Formulation 5A with 5% ascorbic acid added thereto. The CoWP etch results were as follows and demonstrate the ability of the reducing agent to further inhibit CoWP etching. Formulation 5A inhibited the metal cap (CoWP0 etch rate compared to the dHF control and the presence of a reducing agent in Formulation 5B inhibited the CoWP etch rate even more.

TABLE 5

| Formulation | CoWP Etch rate Å/min |
| --- | --- |
| 5A | 6.5 |
| 5B | 3.2 |
| Control | 18 |

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

The invention claimed is:

1. An aqueous, acidic cleaning composition for cleaning Cu-dual damascene microelectronic structures, the composition comprising a formulation of:
(a) from about 68.45% to about 98.95% water;
(b) from about 0.3% to about 8% by weight of at least one alkanolamine or aminophenol;
(c) from about 0.1% to about 2% of at least one metal chelating agent;
(d) from about 0.05% to about 1.6% of at least one tetraalkylammonium fluoride;
(e) from about 0.1% to about 5% of hydrogen fluoride; and
(f) from greater than 0% to about 15% of at least one non-ionic surfactant that contains ethylene oxide chains or ethylene oxide/ethylene glycol chains;
wherein the percentages are weight percent based on the total weight of the formulation and the composition has a pH of from about 4 to about 5.5.

2. An aqueous, acidic cleaning composition of claim 1 comprising a formulation of:
(a) from about 69.46% to about 89.5% water;
(b) from about 3% to about 8% by weight of at least one alkanolamine or aminophenol;
(c) from about 1% to about 2% of at least one metal chelating agent;
(d) from about 0.5% to about 1.6% of at least one tetraalkylammonium fluoride;
(e) from about 1% to about 5% of hydrogen fluoride; and
(f) from about 5% to about 15% of at least one non-ionic surfactant that contains ethylene oxide chains or ethylene oxide/ethylene glycol chains.

3. An aqueous, acidic cleaning composition of claim 1 comprising a formulation of:
(a) from about 96.86% to about 98.95% water;
(b) from about 0.3% to about 0.8% by weight of at least one alkanolamine or aminophenol;
(c) from about 0.1% to about 0.2% of at least one metal chelating agent;
(d) from about 0.05% to about 0.16% of at least one tetraalkylammonium fluoride;
(e) from about 0.1% to about 0.5% of hydrogen fluoride; and
(f) from greater than 0% to about 1.5% of at least one non-ionic surfactant that contains ethylene oxide chains or ethylene oxide/ethylene glycol chains.

4. An aqueous, acidic cleaning composition of claim 3 wherein the cleaning composition additionally comprises a reducing agent in the formulation in an amount of from about 0.5% to about 20% by weight based on the total weight of the other components in the formulation.

5. An aqueous, acidic cleaning composition of claim 1 wherein the formulation comprises: water, monoethanolamine, 1,2-cyclohexanediamine tetraacetic acid, tetramethylammonium fluoride, HF and a surfactant of the formula

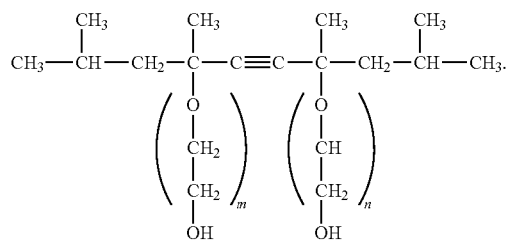

6. An aqueous, acidic cleaning composition of claim 2 wherein the formulation comprises: water, monoethanolamine, 1,2-cyclohexanediamine tetraacetic acid, tetramethylammonium fluoride, HF and a surfactant of the formula

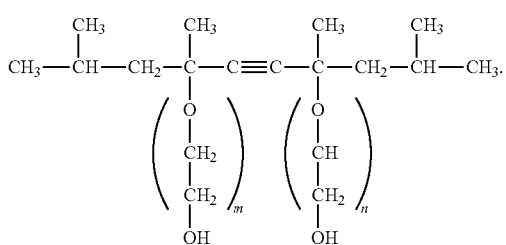

7. An aqueous, acidic cleaning composition of claim 3 wherein the formulation comprises: water, monoethanolamine, 1,2-cyclohexanediamine tetraacetic acid, tetramethylammonium fluoride, HF, and a polyoxyethylene substituted alkynol surfactant.

8. An aqueous, acidic cleaning composition of claim 3 wherein the formulation further comprises a reducing agent comprising ascorbic acid.

9. An aqueous, acidic cleaning composition of claim 5 wherein the formulation comprises:
(a) about 78% water;
(b) about 3.85% monoethanolamine;
(c) about 1.87% 1,2-cyclohexanediamine tetraacetic acid;
(d) about 0.77% tetramethylammonium fluoride;
(e) about 1.2% HF; and
(f) about 14.3% a polyoxyethylene substituted alkynol surfactant.

10. An aqueous, acidic cleaning composition of claim 7 wherein the formulation comprises:
(a) about 98% water;
(b) about 0.35% monoethanolamine;
(c) about 0.17% 1,2-cyclohexanediamine tetraacetic acid;
(d) about 0.07% tetramethylammonium fluoride;
(e) about 0.11% HF; and
(f) about 1.3% a polyoxyethylene substituted alkynol surfactant.

11. An aqueous, acidic cleaning composition of claim 10 wherein the formulation additionally comprises ascorbic acid in an amount of from about 2% to about 6% by weight based on the total weight of the other components of the formulation.

12. A method of forming a composition of claim 3 comprising adding about 10 parts by weight of water to 1 part by weight of a formulation comprising:
(a) from about 69.46% to about 89.5% water;
(b) from about 3% to about 8% by weight of at least one alkanolamine or aminophenol;
(c) from about 1% to about 2% of at least one metal chelating agent;
(d) from about 0.5% to about 1.6% of at least one tetraalkylammonium fluoride;
(e) from about 1% to about 5% of hydrogen fluoride; and
(f) from about 5% to about 15% of at least one non-ionic surfactant that contains ethylene oxide chains or ethylene oxide/ethylene glycol chains, wherein the percentages are by weight based on the total weight of the formulation.

13. A method of forming a composition of claim 4 comprising:
(1) adding about 10 parts by weight of water to 1 part by weight of a formulation comprising:
(a) from about 69.46% to about 89.5% water;
(b) from about 3% to about 8% by weight of at least one alkanolamine or aminophenol;
(c) from about 1% to about 2% of at least one metal chelating agent;
(d) from about 0.5% to about 1.6% of at least one tetraalkylammonium fluoride;
(e) from about 1% to about 5% of hydrogen fluoride; and
(f) from about 5% to about 15% of at least one non-ionic surfactant that contains ethylene oxide chains or ethylene oxide/ethylene glycol chains, wherein the percentages are by weight based on the total weight of the formulation, and
(2) adding to said resulting mixture a reducing agent in an amount of from about 0.5% to about 20% by weight based on the total weight of the other components in the resulting mixture.

* * * * *